United States Patent
Rottner et al.

(10) Patent No.: US 8,253,474 B2
(45) Date of Patent: Aug. 28, 2012

(54) LEAKAGE COMPENSATED ELECTRONIC SWITCH

(75) Inventors: Franz Rottner, Wasserburg (DE); Martin Vital, Amerang (DE)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 13/013,486

(22) Filed: Jan. 25, 2011

(65) Prior Publication Data

US 2012/0188003 A1  Jul. 26, 2012

(51) Int. Cl.
*H03K 17/687* (2006.01)
*H03K 17/60* (2006.01)
(52) U.S. Cl. .................................................. 327/436
(58) Field of Classification Search ........... 327/436
See application file for complete search history.

(56) References Cited

U.S. PATENT DOCUMENTS

| | | | |
|---|---|---|---|
| 4,544,854 A * | 10/1985 | Ulmer et al. | 327/388 |
| 5,910,780 A * | 6/1999 | Tam | 340/2.28 |
| 6,496,047 B1 * | 12/2002 | Iskander et al. | 327/177 |
| 2012/0056867 A1 * | 3/2012 | Van Lier et al. | 345/212 |

* cited by examiner

*Primary Examiner* — Lincoln Donovan
*Assistant Examiner* — Adam Houston
(74) *Attorney, Agent, or Firm* — Chen Yoshimura LLP

(57) ABSTRACT

An electronic circuit for switching purposes comprises a set of at least four electronic switches. A first subset and a second subset comprise at least two electronic switches of said set, respectively. Said at least two electronic switches of said first subset are arranged in a serial connection. Said at least two electronic switches of said second subset are arranged in a serial connection. The electronic circuit comprises a first buffer connected to a first electronic switch of said first subset and a second buffer connected to a second electronic switch of said second subset. Said first buffer minimises a potential drop across said first electronic switch when in open state, and said second buffer minimises a potential drop across said second electronic switch when in open state. The electronic circuit further comprises a switched connection towards ground arranged in between the two subsets.

7 Claims, 3 Drawing Sheets

- Prior Art -

LEAKAGE COMPENSATED ELECTRONIC SWITCH

BACKGROUND

1. Technical Field

The invention relates to an electronic switch for usage in automatic test equipment (ATE) and other precision measurement equipment.

2. Related Art

In ATE for testing of mixed signal devices there is a demand for sharing expensive system instrument resources, particularly high power and precision voltage and current sources, across multiple pins of a device under test (DUT).

Traditional ATE uses mechanical or reed relays to fulfil this requirement. The drawback of this approach is the limited lifetime of relays. Not only that the lifetime of relays at defined load is physically limited, since there are unpredictable malfunctions in the DUT, the relays will be exposed to unpredictable combinations of voltage and current during their lifecycle. The relay approach in traditional ATE is therefore critical from the system reliability point of view. In addition to the described reliability issue, mechanical relays need a relatively long time to operate. This time significantly limits test throughput and drives up testing costs.

There exist a lot of approaches to replace mechanical or reed relays by electronic switches. Unfortunately, all known electronic switches have drawbacks compared to mechanical ones. For high precision measurements, especially the leakage current through an open switch limits possible measurement accuracy and a significant capacitive coupling of the open switch leads to signal crosstalk that impacts dynamic measurements.

SUMMARY

In this background, a general purpose of the present invention is to provide an electronic switch, solving at least one of the above mentioned issues.

The problem is solved by the present invention by a leakage compensated electronic circuit for switching purposes in automatic test equipment. Said electronic circuit comprises a set of at least four electronic switches, an electronic switch having a closed state allowing for desired current flow and an open state disallowing a desired current flow, whereby a first subset of the electronic circuit comprises at least two electronic switches of said set and a second subset comprises at least two other electronic switches of said set.

Said at least two electronic switches of said first subset are arranged in a serial connection, and whereby said at least two electronic switches of said second subset are arranged in a serial connection. Said serial connection of said electronic circuit further comprises a first buffer and a second buffer. Said first buffer is being connected to a first electronic switch of said first subset. Said second buffer is being connected to a second electronic switch of said second subset, whereby said first buffer minimises a potential drop across said first electronic switch when in open state, and said second buffer minimises a potential drop across said second electronic switch when in open state.

The electronic circuit further comprises a switched connection towards ground arranged in between the first subset and the second subset, whereby said connection towards ground, in its closed state, provides a current through said ground connection when in operation, and whereby said current via said ground connection comprises a current flow via said first buffer of said first subset and a current via said second buffer of said second subset.

Generally, said switched connection may comprise any switch known to the man skilled in the art, for switching into a closed state allowing for desired current flow trough said switched connection or for switching into an open state disallowing a desired current flow through said switched connection, respectively. However, according to a preferred embodiment of the invention, said switched connection comprises an electronic switch.

The invention is based on a T-pole architecture to avoid signal crosstalk and contains active circuitry to compensate for leakage currents, while it may also contain protection mechanisms against excessive voltages. It may be used to directly replace mechanical relays and improve ATE systems reliability and test throughput.

In an embodiment of the present invention the leakage compensated electronic circuit comprises a first power supply for supplying said first buffer of said first subset, and a second power supply for supplying said second buffer of said second subset.

In another embodiment of the present invention said first buffer of said first subset is connected in parallel with said first electronic switch of said at least two electronic switches of said first subset, and said second buffer of said second subset is connected in parallel with said second electronic switch of said at least two electronic switches of said second subset.

In another embodiment of the present invention said set of at least four electronic switches is a serial connection of exactly four electronic switches, wherein said first subset of said set comprises exactly two electronic switches of said set, and wherein said second subset of said set comprises exactly two other electronic switches of said set.

In another preferred embodiment of the present invention each of said electronic switches of said set comprises a Transistor.

Generally, each of said electronic switches may comprise any field effect transistor (FET) known to the man skilled in the art. However, according to a preferred embodiment of the invention, each of said electronic switches comprises a MOSFET. It is further preferred that at least one of said electronic switches comprises a MOSFET. In another embodiment, the electronic switch comprises a DGMOSFET, FREDFET, HEMT, IGBT, JFET, MESFET, MODFET, NOMFET and/or an OFET. Such embodiments may have different advantages, such as, for example, very fast recovery (turn-off) of the body diode of the FET, very fast switching transistors and/or low-cost electronic circuits.

In another embodiment of the present invention said first subset of said set and said second subset of said set are arranged in a serial connection.

BRIEF DESCRIPTION OF THE DRAWINGS

Some embodiments of apparatus and/or methods in accordance with embodiments of the present invention are now described, by way of example only, and with reference to the accompanying drawings, in which.

DESCRIPTION OF EXEMPLARY EMBODIMENTS

The invention will now be described based on preferred embodiments which do not intend to limit the scope of the present invention but exemplify the invention. All of the features and the combinations thereof described in the embodiment are not necessarily essential to the invention.

In this specification, a "condition where a member A is connected to a member B" refers to the condition where the member A and the member B are physically connected to each other directly and to the condition where the member A and the member B are connected indirectly via other members that do not affect the electrical connection. Similarly, a "condition where a member C is provided between the member A and the member B" refers to, in addition to the condition where the member A and the member C or the member B and the member C are connected to one another directly, the condition where the members are connected indirectly via other members that do not affect the electrical connection.

The embodiments explained in the following relate to test equipment, and more specifically, automatic test equipment (ATE), for testing a device under test (DUT).

Figure 1:
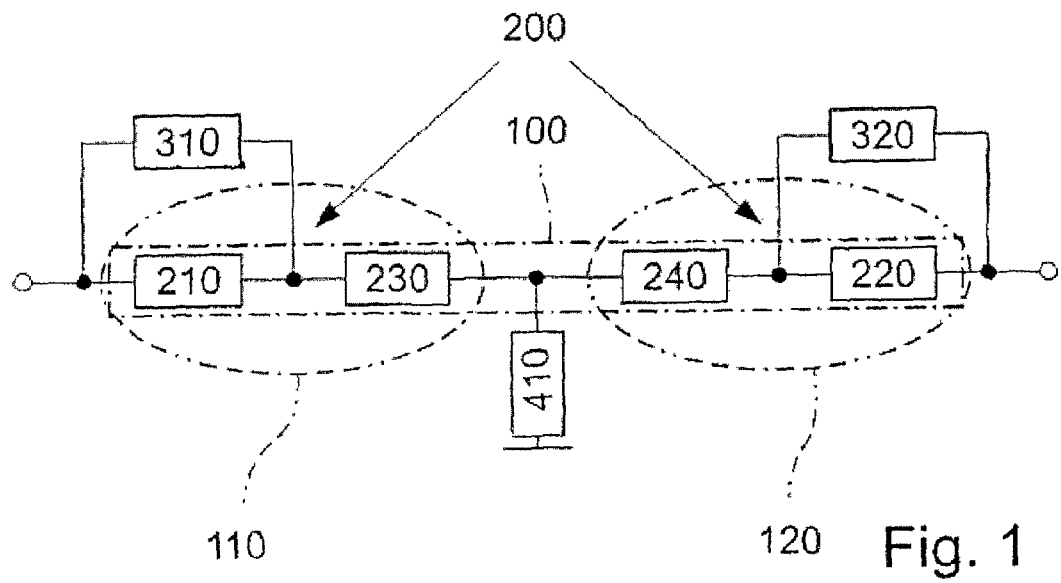
FIG. 1 schematically illustrates a simplified diagram showing a leakage compensated switch according to the invention.

FIG. 1 schematically illustrates a simplified diagram showing a leakage compensated switch according to an embodiment of the invention.

The leakage compensated electronic circuit for switching purposes in an automatic test equipment comprises a set 100 of at least four electronic switches 200, an electronic switch having a closed state allowing for desired current flow and an open state disallowing a desired current flow, whereby a first subset 110 comprises at least two electronic switches 210, 230 of said set 100, a second subset 120 comprises at least two other electronic switches 220, 240 of said set 100, said at least two electronic switches 210, 230 of said first subset 110 are arranged in a serial connection.

Said at least two electronic switches 220, 240 of said second subset 120 are arranged in a serial connection. The automatic test equipment further comprises a first buffer 310 and a second buffer 320, said first buffer 310 is connected to a first electronic switch 210 of said first subset 110, said second buffer 320 is connected to a second electronic switch 220 of said second subset 120, whereby said first buffer 310 minimises a potential drop across said first electronic switch 210 when in open state, and said second buffer 320 minimises a potential drop across said second electronic switch 220 when in open state.

The electronic circuit further comprises a switched connection towards ground 410 arranged in between the first subset 110 and the second subset 120, whereby said connection towards ground 410, in its closed state, provides a current through said ground connection 410 when in operation. Said current via said ground connection 410 comprises a current flow via said first buffer 310 of said first subset 110 and a current via said second buffer 320 of said second subset 120.

Figure 2:
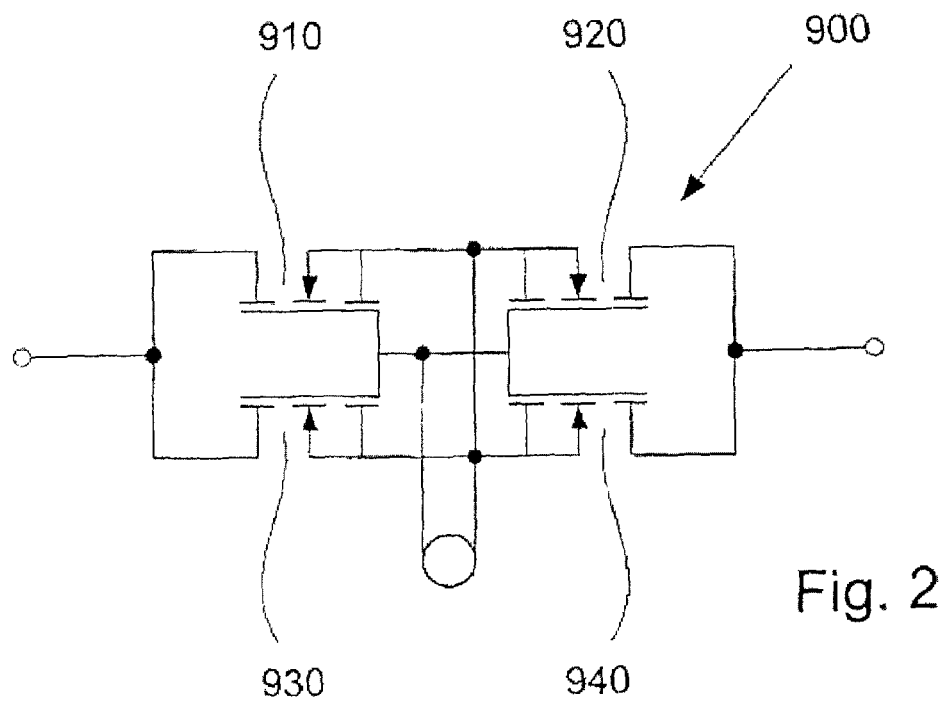
FIG. 2 schematically illustrates a conventional electronic switch realized with MOSFETs.
Figure 3:
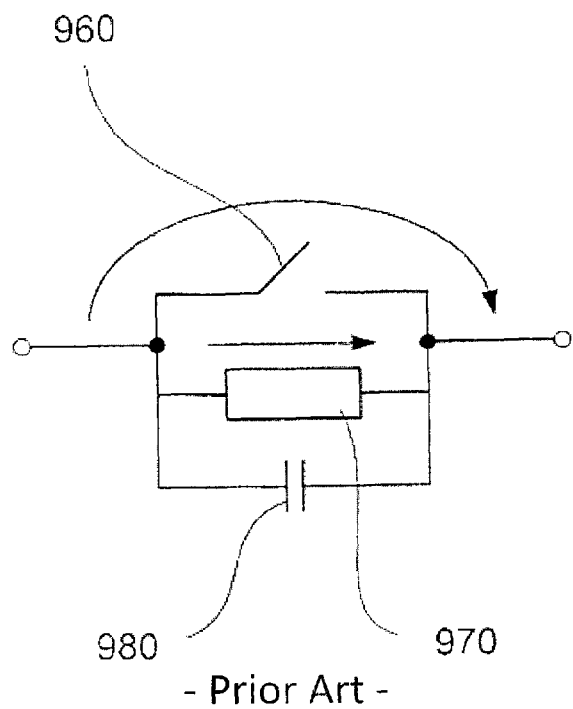
FIG. 3 schematically illustrates an equivalent circuit of a conventional electronic switch realized with MOSFETs.

FIG. 2 schematically illustrates a traditional electronic switch realized with MOSFETs, while FIG. 3 schematically illustrates an equivalent circuit of the same electronic switch. The equivalent circuit consists of a switch, a resistor and a capacitor. All three components are connected together in parallel.

It can be seen that even if the switch is open, the voltage drop over the parallel circuit causes a leakage current flow through the resistor part of the electronic MOSFET switch, while crosstalk is caused by the capacitor part of the MOSFET switch.

Furthermore, it can be seen that a voltage drop over an electronic switch causes a leakage current through the switch. The leakage current depends on the voltage and on the temperature of the electronic switch. The parallel capacity causes crosstalk over the electronic switch.

Figure 4:
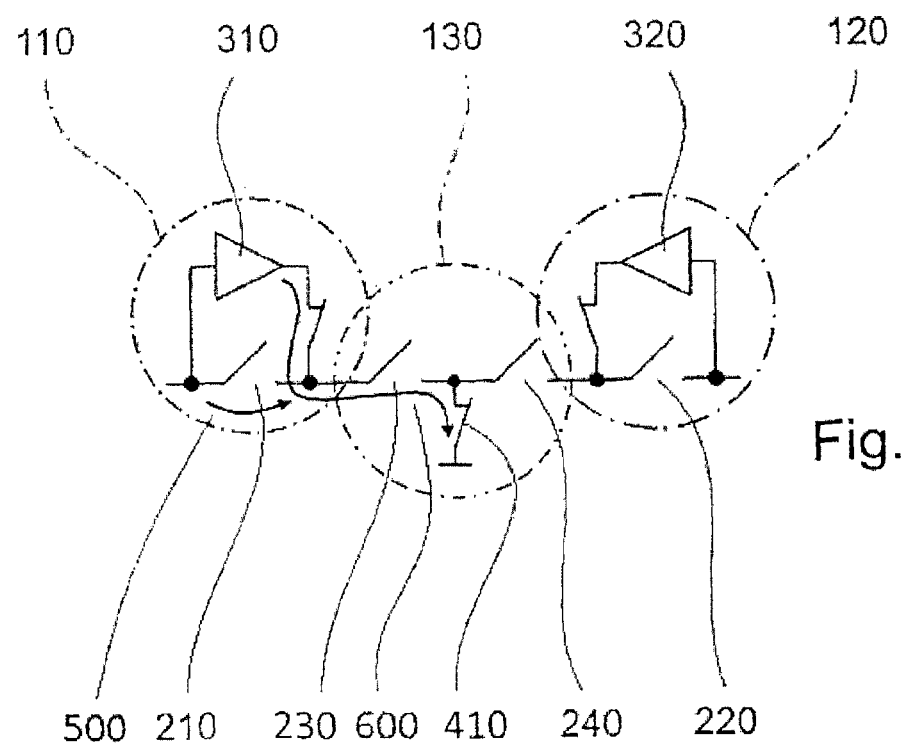
FIG. 4 schematically illustrates a block diagram and the function of a leakage compensated switch in open state according to the invention.

FIG. 4 schematically illustrates a block diagram of a leakage compensated switch in open state according to the invention. The leakage compensated electronic switch consists of four serial MOSFET switches 210, 220, 230, 240. A known T-switch structure 130 with a switch to ground 410 is placed in the middle. On both sides, a leakage compensated switch with buffer 310, 320 is placed.

Moreover, FIG. 4 schematically illustrates the function of an electronic switch in open state according to the invention. In open state the switch to ground 410 is closed, thus allowing for a desired current flow 600 to ground. The four serial MOSFET switches 210, 220, 230, 240 each are in open state. The external voltage is buffered 310, 320 and provided between the first two switches 210, 220. The voltage difference 500 between the external voltage and internal voltage is about 0V. Therefore no current can flow from the external voltage source. The leakage current 600 through the second internal switch 230, 240 comes from the power supply of the leakage buffer.

Figure 5:
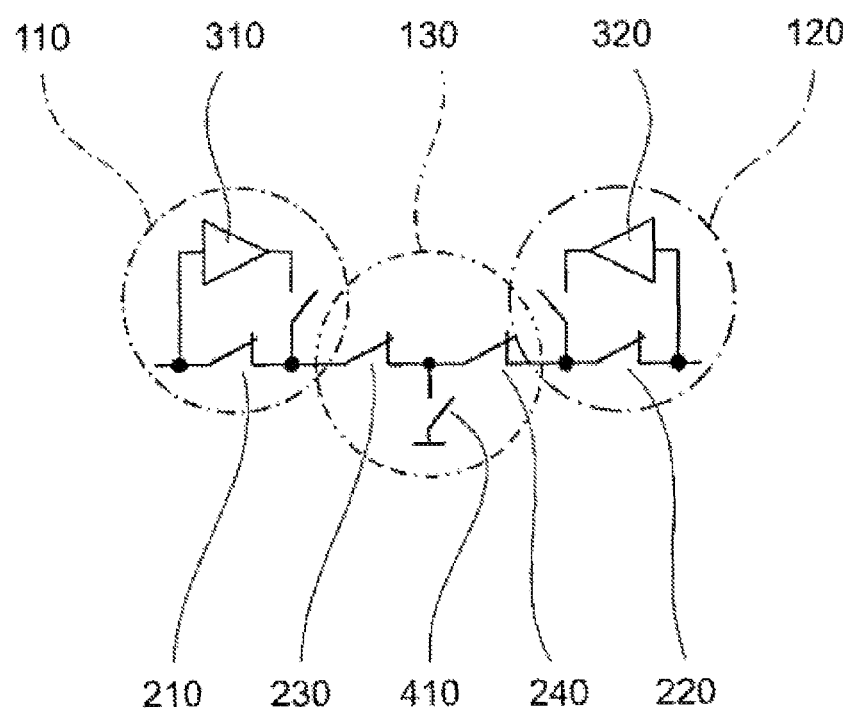
FIG. 5 schematically illustrates a block diagram of a leakage compensated switch in closed state according to the invention.

FIG. 5 schematically illustrates a block diagram of a leakage compensated switch in closed state according to the invention. In closed state the switch to ground 410 is open, while the four serial MOSFET switches 210, 220, 230, 240 each are in closed state, thus allowing for a desired current flow through each of the four serial MOSFET switches. In closed state the buffers 310, 320 each are in disconnected state to the circuit.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

What is claimed is:

1. Leakage compensated electronic circuit for switching purposes in an automatic test equipment, comprising
   a set of at least four electronic switches, an electronic switch having a closed state allowing for desired current flow and an open state disallowing a desired current flow, whereby
   a first subset comprises at least two electronic switches of said set,
   a second subset comprises at least two other electronic switches of said set,
   said at least two electronic switches of said first subset are arranged in a serial connection such that desired current flows from a first electronic switch of said first subset to a second electronic switch of said first subset, and whereby said at least two electronic switches of said second subset are arranged in a serial connection such that desired current flows from a first electronic switch of said second subset to a second electronic switch of said second subset, and further comprising a first buffer and a second buffer, said first buffer being connected to the first electronic switch of said first subset such that an input side of the first buffer is connected to the first electronic switch of said first subset and an output side of the first buffer is connected, via a switch, to the first electronic switch of said first subset and the second electronic switch of said first subset, said second buffer being connected to the second electronic switch of said second subset such that an input side of the second buffer is connected to the second electronic switch of said second subset and an output side of the second buffer is connected, via a switch, to the first electronic switch of said second subset and the second electronic switch of said second subset, whereby said first buffer minimises a potential drop across said first electronic switch when in open state, and said second buffer minimises a potential drop across said second electronic switch when in open state, and the electronic circuit further comprising a switched connection towards ground arranged in between the first subset and the second subset, whereby said connection towards ground, in its closed state, provides a current through said ground connection when in operation, and whereby said current via said ground connection comprises a current flow via said first buffer of said first subset and a current via said second buffer of said second subset.

2. The leakage compensated electronic circuit according to claim 1, comprising
   a first power supply for supplying said first buffer of said first subset, and
   a second power supply for supplying said second buffer of said second subset.

3. The leakage compensated electronic circuit according to claim 1, wherein
   said first buffer of said first subset is connected in parallel with said first electronic switch of said at least two electronic switches of said first subset, and
   said second buffer of said second subset is connected in parallel with said second electronic switch of said at least two electronic switches of said second subset.

4. The leakage compensated electronic circuit according to claim 1, wherein
   said set of at least four electronic switches is a serial connection of exactly four electronic switches, wherein
   said first subset of said set comprises exactly two electronic switches of said set, and wherein
   said second subset of said set comprises exactly two other electronic switches of said set.

5. The leakage compensated electronic circuit according to claim 1, wherein
   each of said electronic switches of said set comprises a Transistor.

6. The leakage compensated electronic circuit according to claim 1, wherein
   each of said electronic switches comprises a MOSFET.

7. The leakage compensated electronic circuit according to claim 1, wherein
   said first subset of said set and said second subset of said set are arranged in a serial connection.

* * * * *